(12) United States Patent
Danielson

(10) Patent No.: US 10,426,068 B1
(45) Date of Patent: Sep. 24, 2019

(54) COLLAPSIBLE RADIATION SHIELD

(71) Applicant: Jesse I. Danielson, San Pablo, CA (US)

(72) Inventor: Jesse I. Danielson, San Pablo, CA (US)

( * ) Notice: Subject to any disclaimer, the term of this patent is extended or adjusted under 35 U.S.C. 154(b) by 0 days.

(21) Appl. No.: 16/255,972

(22) Filed: Jan. 24, 2019

(51) Int. Cl.
*H05K 9/00* (2006.01)
*G01R 22/06* (2006.01)

(52) U.S. Cl.
CPC ......... *H05K 9/0043* (2013.01); *G01R 22/061* (2013.01)

(58) Field of Classification Search
CPC .................. H05K 9/0043; G01R 22/061
See application file for complete search history.

(56) References Cited

U.S. PATENT DOCUMENTS

| | | | |
|---|---|---|---|
| 2,599,944 A | 6/1952 | Salisbury | |
| 4,298,839 A | 11/1981 | Johnston | |
| 4,584,527 A | 4/1986 | Amigo | |
| 4,638,166 A | 1/1987 | Baudro | |
| 4,744,004 A * | 5/1988 | Hammond | G01R 22/065 324/156 |
| 4,795,975 A * | 1/1989 | Cox | G01R 1/04 174/355 |
| 5,027,061 A * | 6/1991 | Palmer | G01R 1/18 174/377 |
| 5,499,159 A * | 3/1996 | Gatz | H02B 1/03 220/324 |
| D408,826 S | 4/1999 | Gargasz et al. | |
| 6,280,805 B1 * | 8/2001 | Markovich | G01R 11/04 324/110 |
| 6,380,482 B1 * | 4/2002 | Norte | H05K 9/0043 174/382 |
| 6,835,945 B2 | 12/2004 | Mosser et al. | |
| 7,019,666 B2 * | 3/2006 | Tootoonian Mashhad | G01D 4/004 324/157 |
| D588,478 S | 3/2009 | Nemeth et al. | |
| 7,619,878 B1 * | 11/2009 | Cook | G01D 4/02 137/364 |
| 7,800,890 B1 * | 9/2010 | Therrien | G01R 22/065 324/156 |
| 7,829,873 B2 | 11/2010 | Fox et al. | |
| 8,143,607 B2 | 3/2012 | Teodorescu | |
| 8,605,457 B2 * | 12/2013 | Khan | G01R 22/063 343/791 |
| 8,861,227 B2 * | 10/2014 | Manion | G01D 11/24 174/520 |
| 8,867,233 B2 * | 10/2014 | Manion | G01D 4/002 174/520 |
| D751,256 S | 3/2016 | Pizarro | |
| 2009/0078891 A1 | 3/2009 | Oyaizu | |
| 2015/0382517 A1 * | 12/2015 | LaPrise | H05K 9/0043 174/378 |

\* cited by examiner

*Primary Examiner* — Hung V Ngo
(74) *Attorney, Agent, or Firm* — Cramer Patent & Design, PLLC; Aaron R. Cramer

(57) ABSTRACT

A collapsible shield for shielding an electromagnetic field ("EMF") shield has a tubular configuration with an open top and a ground connection to shunt away internally generated EMF's. The device further comprises an internal spring frame that enables the device to expand or contract.

20 Claims, 4 Drawing Sheets

COLLAPSIBLE RADIATION SHIELD

FIELD OF THE INVENTION

The presently disclosed subject matter is directed to a collapsible radiation shield.

BACKGROUND OF THE INVENTION

Many electrical utilities have resorted to the use of "smart" electrical meters to analyze, report, and even control electrical usage. The ability to report usage eliminates the need for a "meter reader" to periodically visit the meter to record the KwH usage. While this feature may result in more accurate readings and reduction in utility company manpower, it does require that the smart meter emit electromagnetic radiation in the form of an RF signal. And as with nearly all forms of RF energy, it penetrates all objects, including people, who may be nearby.

Such radiation effects different people differently with some reporting severe headaches, body pains, and other physiological effect. The market has responded with shields that greatly reduce measured EMF (electromagnetic field) levels from these meters. Unfortunately, they are large, unwieldy and difficult and costly to ship. Accordingly, there is a need for a means by EMF shields for smart meters can be reduced in size to allow for easier shipment. The development of the collapsible EMF shield for electric utility meters 10 fulfills this need.

SUMMARY OF THE INVENTION

The principles of the present invention provide for a collapsible shield comprising a tubular side surface which is bonded mechanically and electrically to a base band. The tubular side surface is made of a flexible metal screen bonded together both mechanically and electrically at a face seam and a side seam. The base band is provided with an access slot, which is used to accommodate any seal/locking mechanisms present on an utility revenue meter. The shield also comprises a face made of the flexible metal screen bonded together both mechanically and electrically at the face seam and the side seam. The side surface and the face are provided with structural integrity by the face seam and the base band as well as a spiral nature of the spring band.

The shield also has an open end placed over the electric utility revenue meter and slid until the base band is directly adjacent to a retaining collar of the electric utility revenue meter, electrical continuity of the base band, essential to mainlining EMF shielding, is provided by a pair of upper tabs, a spring band provided around a perimeter of the side surface in a spiraling position, the spring band is fastened at a first end to the base band and is fastened at a second end to the face seam, the spring band allows the collapsible shield to retain being open and expanded and a plurality of spring clips which are mechanically and electrically mated to the base band via use of a fastener, the spring clips are connected to the retaining collar on the electric utility revenue meter.

The flexible metal screen may provide both visual clarity through its surface for purposes of verification of electricity usage for billing purposes and blocks electromagnetic force radiation of certain frequencies. The flexible metal screen may be made of an anti-corrosion material comprising stainless steel. The stainless steel may be coated with an anti-corrosion finish selected from the group of a galvanizing finish, a plating finish, or a painting finish. The anti-corrosion material is made of conventional steel material.

The conventional steel material may be coated with an anti-corrosion finish which is selected from the group of a galvanizing finish, a plating finish, or a painting finish. The flexible metal screens may be electrically and physically attached to the base band and extend inward. The base band may be eight inches in diameter and six inches in height. The spring band may be fastened continuously to the side surface and may be periodically fastened to the side surface.

The spring band is made of plastic which retains a memory of its expanded position or metal which retains a memory of its expanded position. The shield may also comprise a collapsed state which occurs with application of an external force upon the face and which spans across the perimeter of the face seam. The collapsed state may be maintained by a temporary retraining device selected from the group consisting of a tape, an elastic band, or a nylon strap. The temporary retraining device may allow for easy removal of the collapsible shield from a shipping container upon receipt, after purchase, or prior to installation. The fastener may be a rivet or a screw. The shield may also comprise a securing aid to further aids in retaining of the collapsible shield to the retaining collar. The collapsible shield may also comprise a generally cylindrical shape.

BRIEF DESCRIPTION OF THE DRAWINGS

The advantages and features of the present invention will become better understood with reference to the following more detailed description and claims taken in conjunction with the accompanying drawings, in which like elements are identified with like symbols, and in which:

Figure 1:
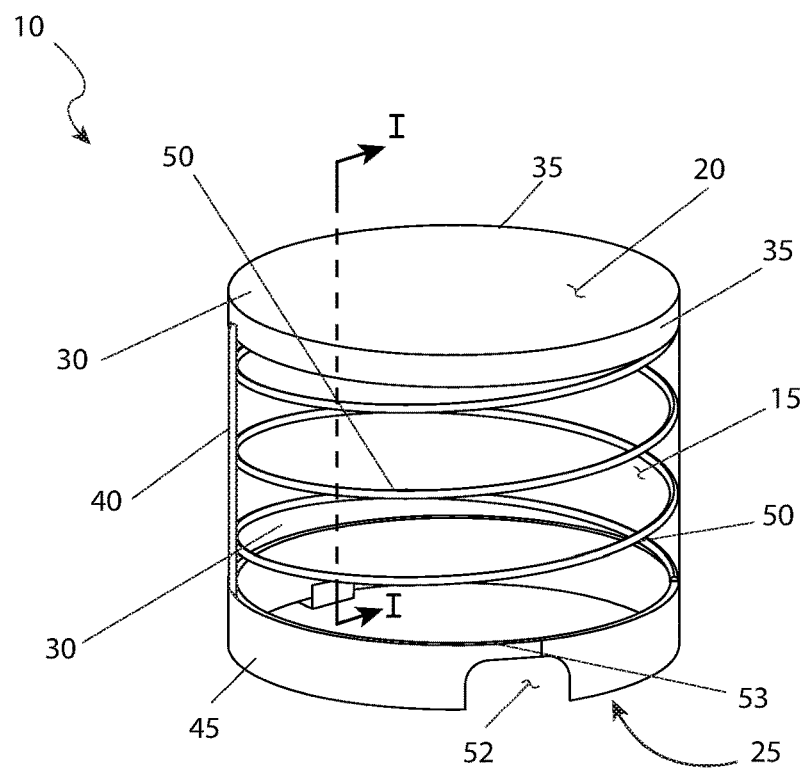
FIG. 1 is a perspective view of the collapsible shield 10 in its expanded state, according to the preferred embodiment of the present invention.

DESCRIPTIVE KEY 10 collapsible shield
15 side surface
20 face
25 open end
30 flexible metal screen
35 face seam
40 side seam
45 base band
50 spring band
52 access slot
53 upper tabs
55 external force "f"

60 temporary retraining device
65 shipping container
70 spring clip
75 fastener
80 electric utility revenue meter
85 meter base enclosure
90 structure
95 retaining collar
100 securing aid
105 anti-tamper seal

DESCRIPTION OF THE PREFERRED EMBODIMENTS

The best mode for carrying out the invention is presented in terms of its preferred embodiment, herein depicted within FIGS. 1 through 5. However, the invention is not limited to the described embodiment, and a person skilled in the art will appreciate that many other embodiments of the invention are possible without deviating from the basic concept of the invention and that any such work around will also fall under scope of this invention. It is envisioned that other styles and configurations of the present invention can be easily incorporated into the teachings of the present invention, and only one (1) particular configuration shall be shown and described for purposes of clarity and disclosure and not by way of limitation of scope. All of the implementations described below are exemplary implementations provided to enable persons skilled in the art to make or use the embodiments of the disclosure and are not intended to limit the scope of the disclosure, which is defined by the claims.

The terms "a" and "an" herein do not denote a limitation of quantity, but rather denote the presence of at least one (1) of the referenced items.

1. Detailed Description of the Figures

Referring now to FIG. 1, a front view of the collapsible shield s 10, according to the preferred embodiment of the present invention is disclosed. The collapsible shield 10 (herein also described as the "device") 10, is generally of a cylindrical shape having a tubular side surface 15, a face 20 and an open end 25 and is configured to secure over an electric utility revenue meter 80 and shield the environment from emittance of radiation therefrom.

The side surface 15 and the face 20 of the device 10 are manufactured of a flexible metal screen 30 and are bonded together both mechanically and electrically, at a face seam 35 and a side seam 40. The side surface 15 is also bonded mechanically and electrically to a base band 45. The functionality of the base band 45 will be described in greater detail herein below. It is envisioned that the flexible metal screen 30 as well as the base band 45 is made of an anti-corrosion material such as stainless steel or of a conventional steel material that is coated with an anti-corrosion finish such as galvanizing, plating, or painting. However, any material that is conductive to electromagnetic frequencies can be used with equivalent results, and as such, the use of any particular type of material should not be interpreted as a limiting factor of the present invention.

A spring band 50 is provided around the perimeter of the side surface 15 in a spiraling position as shown. The natural resting state of the spring band 50 is as shown. The spring band 50 is envisioned to be manufactured from a plastic material, metal material, or the like which retains a memory of its expanded position. It is fastened at a first end to the base band 45 and is fastened at a second end to the face seam 35. It may or may not be fastened continuously or periodically to the side surface 15. The purpose of the spring band 50 is to allow the device 10 to retain its open and expanded stated as shown.

Figure 6:
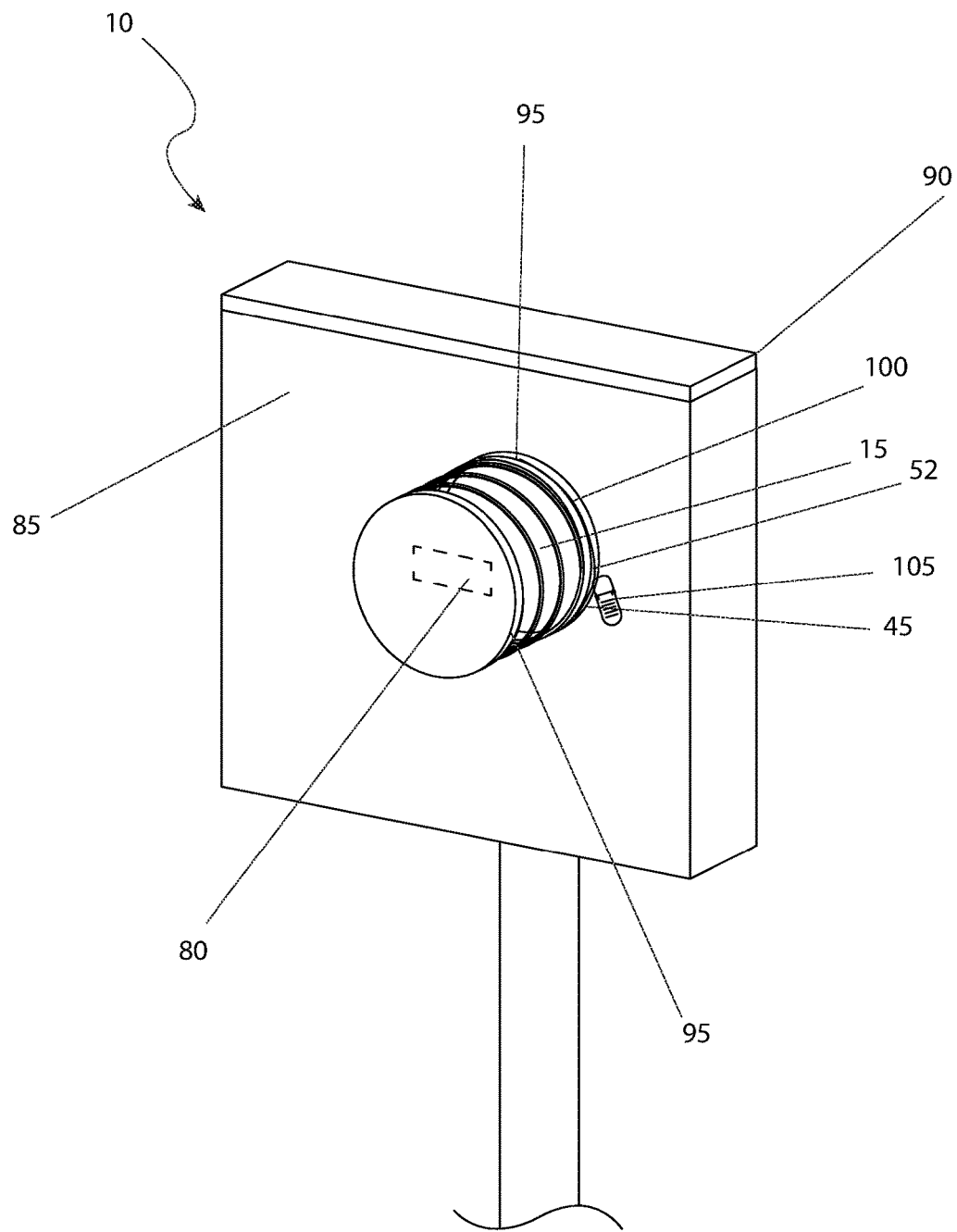

The base band 45 is provided with an access slot 52, which is used to accommodate any seal/locking mechanisms present on electric utility revenue meters (see FIG. 6). Electrical continuity of the base band 45, essential to mainlining EMF shielding, is provided by two (2) upper tabs 53. It is noted that the overall dimensions of the device 10 will vary per specific model. Sizing will be in accordance with size of the electric utility meter utilized with the device 10. However, typical sizing would be approximately eight inches (8 in.) in diameter and six inches (6 in.) in height.

Figure 2:
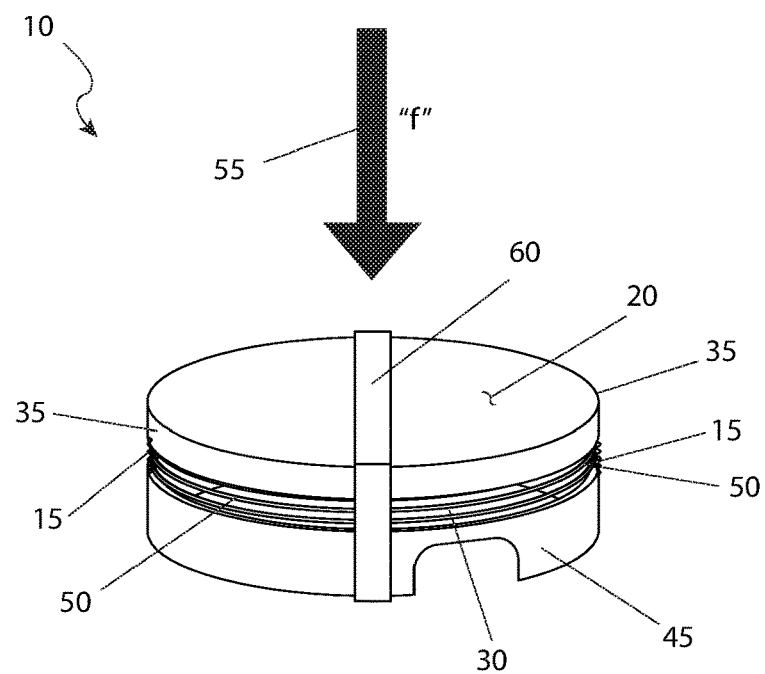
FIG. 2 is a perspective view of the collapsible shield 10 in its collapsed state, according to the preferred embodiment of the present invention.

Referring next to FIG. 2, a perspective view of the device 10, in its collapsed state, according to the preferred embodiment of the present invention is depicted. The collapsed state as shown will occur with the application of an external force "f" 55 upon the face 20 and which spans across the perimeter of the face seam 35. The external force "f" 55 is envisioned to be generated by a hand acting against a solid surface such as a countertop, table, workbench, or the like. Once in a collapsed state as shown, the overall shape would be maintained by a temporary retraining device 60 such as tape, an elastic band, a nylon strap or the like. The temporary retraining device 60 would be applied after initial manufacture and remain in place during shipping and transport. It would be removed by the final user immediately prior to installation. It is noted that the spring band 50 is in a compressed state along with the flexible metal screen 30 of the side surface 15 which is in a random crumpled, but compressed state. It is noted that while the overall diameter of the device 10 remains the same at eight inches (8 in.) for a typical device 10, the overall height of the device 10 has been reduced from approximately six inches (6 in.) to approximately one and a half inches (1½ in.).

Figure 3:
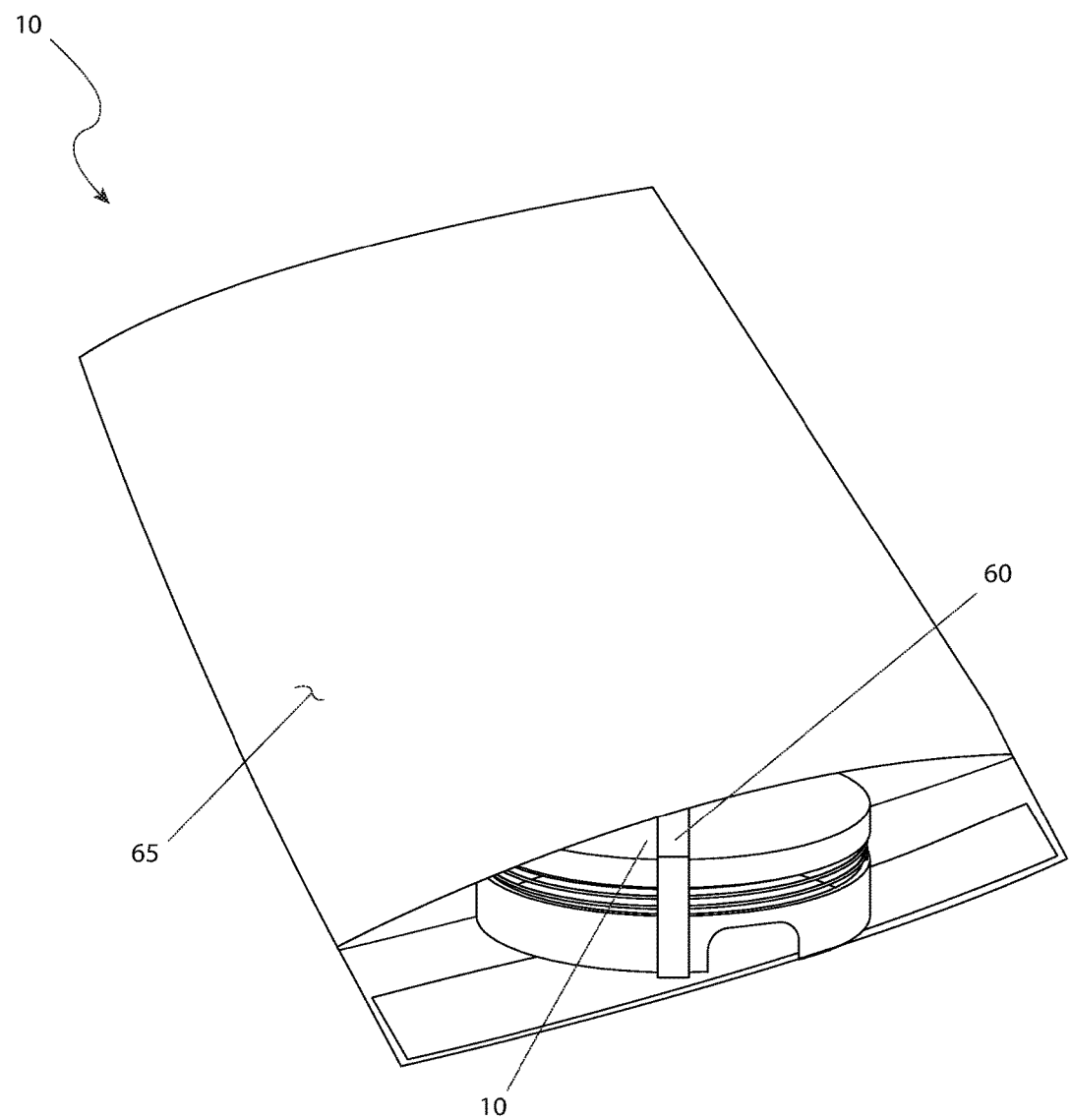
FIG. 3 is a perspective view of the collapsible shield 10 shown within a shipping container 65, according to the preferred embodiment of the present invention.

Referring now to FIG. 3, a perspective view of the device 10, shown within a shipping container 65, according to the preferred embodiment of the present invention is shown. The shipping container 65 is herein depicted as a shipping envelope for purposes of illustration, although other types of shipping container 65 including, but not limited to: boxes, crates, and bags may also be utilized, and as such, the use of any specific type of shipping container 65 should not be interpreted as a limiting factor of the present invention. Additionally, while only one (1) device 10 is shown within the shipping container 65, it is understood that additional device 10 may be included within the shipping container 65. The device 10 is in a collapsed state, as shown in FIG. 2, and held in a collapsed state by the temporary retraining device 60 to allow for easy removal of the device 10 from the shipping container 65 upon receipt, after purchase, and/or prior to installation.

Figure 4:
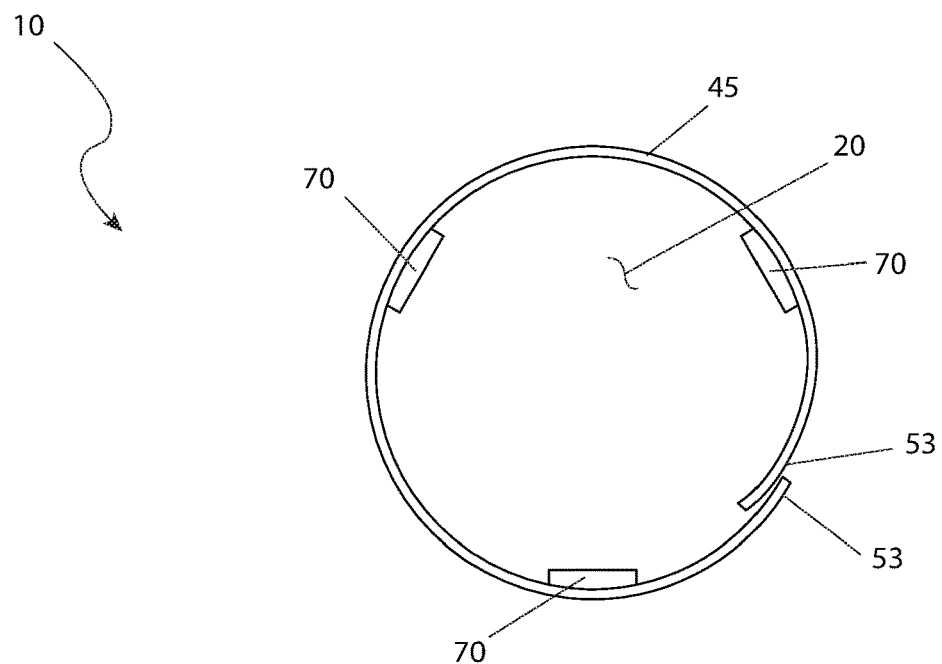
FIG. 4 is a bottom view of the open end of the collapsible shield 10, according to the preferred embodiment of the present invention.

Referring next to FIG. 4, a bottom view of the open end of the device 10, according to the preferred embodiment of the present invention is disclosed. This view discloses the base band 45 along its circular axis, with the face 20 visible in the middle. At least three (3) flexible metal screens 30 are electrically and physically attached to the base band 45 and extend inward. It is envisioned that the fastener 75 would be manufactured from beryllium copper, copper clad stainless steel or similar materials that are highly conductive, resistant to corrosion and maintain a high spring tensile strength. The use of any particular type of material is not intended to be a limiting factor of the present invention. The fastener 75 will contact the grounded metal base ring supplied as standard equipment on all electric utility meters. It is noted that the two (2) upper tabs 53 are also visible in this FIGURE and provide continuous electrical continuity due to their overlapping nature. The upper tabs 53 are adjacent to the access slot 52, as shown in FIG. 1.

Figure 5:
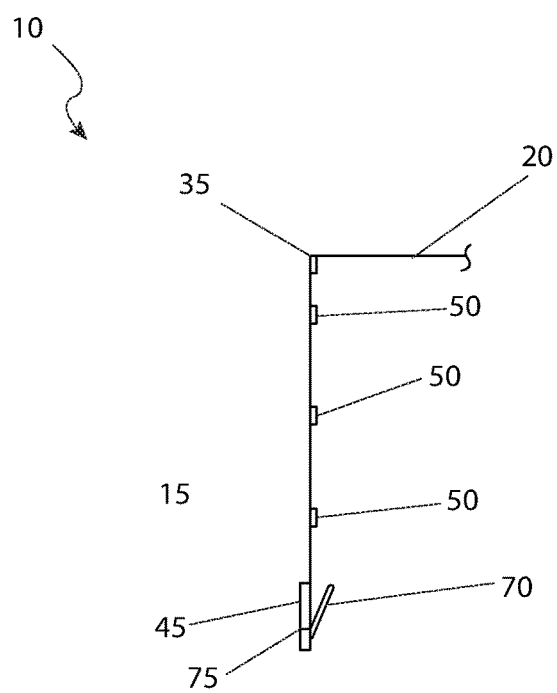
FIG. 5 is a sectional view of the collapsible shield 10, as seen along a line I-I, as shown in FIG. 1, according to the preferred embodiment of the present invention; and, FIG. 6 is an environmental perspective view of the collapsible shield 10 shown in a utilized state on an electric utility revenue meter 80, according to the preferred embodiment of the present invention.

Referring now to FIG. 5, a sectional view of the device 10, as seen along a line I-I, as shown in FIG. 1, according to the preferred embodiment of the present invention is depicted. This view discloses the face 20 and the side surface 15, which are each made of a flexible metal screen 30 (as shown in FIG. 1) that provides both visual clarity through its surface but blocks electromagnetic force radiation of certain frequencies. The side surface 15 and the face 20 are provided structural integrity by the face seam 35 and base band 45 as well as the spiral nature of the spring band 50. It is noted that one (1) of the spring clips 70 is visible and further clarifies its protruding nature. The spring clips 70 are mechanically and electrically mated to the base band 45 via use of a fastener 75 such as a rivet or screw.

Referring finally to FIG. 6, a perspective view of the device 10, shown in a utilized state, according to the preferred embodiment of the present is shown. The device 10 is mounted upon an electric utility revenue meter 80, preferably of the "smart" nature which emits electromagnetic radiation. The electric utility revenue meter 80 is provided upon a meter base enclosure 85 as is typically expected and is located on the exterior of a structure 90 such as a residence, commercial or industrial establishment. The screen-like nature of the face 20 allows for vision of the electric utility revenue meter 80 for the purposes of verification of electricity usage for billing purposes. The spring like nature of the spring band 50 maintains the side surface 15 in an extended state. The spring clips 70 (not visible in this FIGURE due to illustrative limitations) are connected to a retaining collar 95 on the electric utility revenue meter 80. This connection provides multiple features. First, the connection can be made without the use of tools or the disassembly of the electric utility revenue meter 80 or meter base enclosure 85. It is simply placed over the glass enclosure of the electric utility revenue meter 80 and pressed into place whereupon the spring clips 70 engage the retaining collar 95. Second, the spring like nature of the spring clips 70 maintain the position of the device 10 and hold the device 10 in place regardless of external events such as inclement weather, wind, accidental contact, or the like. Third, the electrically conductive nature of the spring clips 70 maintain a singular electrical potential between all metallic surfaces including but not limited to the face 20, the side surface 15, the base band 45, the retaining collar 95 and the meter base enclosure 85.

To further aid in the retention of the device 10 to the retaining collar, a securing aid 100 is utilized. The securing aid may be, but is not limited to, a pipe clamp, a "zip-tie", an elastic strap, or the like. The exact nature of the securing aid 100 is not intended to be a limiting factor of the present invention. It is noted that the access slot 52 accommodates an anti-tamper seal 105, which may or may not be present on the retaining collar 95. Finally, due to this electrically conductive nature, all electromagnetic force (EMF) radiation is contained within the device 10 and the meter base enclosure 85 and is thus unable to negatively affect living organism external to the device 10 including but not limited to humans, animals, insects, and plant life.

2. Operation of the Preferred Embodiment

The preferred embodiment of the present invention can be utilized by the common user in a simple and effortless manner with little or no training. It is envisioned that the device 10 would be constructed in general accordance with FIG. 1 through FIG. 5. The user would procure the device 10 through normal procurement channels while paying particular attention to specific size (diameter and overall height) to enclose the electric utility revenue meter 80 and subsequently reduce or prohibit electromagnetic radiation.

After procurement of the device 10 and immediately prior to installation, it would be removed from the shipping container 65; the temporary retraining device 60 removed or cut; and the device 10 allowed to regain its original expanded position by the expanding nature of the spring band 50.

The device 10 would then be installed by the following process; the open end 25 of the device 10 would be placed over the electric utility revenue meter 80 and slid until the base band 45 is directly adjacent to the retaining collar 95 of the electric utility revenue meter 80; the user would then place his hands and fingers equally around the perimeter of the base band 45 and thus press inward until the spring clips 70 engage upon and over the retaining collar 95 thus connecting electrically as well. Should the retaining collar be equipped with an anti-tamper seal 105, it is aligned with the access slot 52. A retaining aid 100 may or may not be installed.

During utilization of the device 10, the EMF shielding nature of the side surface 15 and the face 20 thus captures and conducts radiation to ground through the base band 45, the spring clips 70 and the retaining collar 95 which is electrically grounded through the meter base enclosure 85 to earth ground.

Should the features and benefits of the device 10 no longer be needed, it can simply be removed from the electric utility revenue meter 80 by grasping it around the perimeter base band 45 and pulling it free with a medium application of force. It can subsequently be replaced or placed upon another electric utility revenue meter 80 as needed.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated.

What is claimed is:

1. A collapsible shield comprising:
   a tubular side surface bonded mechanically and electrically to a base band, said tubular side surface made of a flexible metal screen bonded together both mechanically and electrically at a face seam and a side seam, said base band provided with an access slot, which is used to accommodate any seal/locking mechanisms present on a utility revenue meter;
   a face made of said flexible metal screen bonded together both mechanically and electrically at said face seam and said side seam, said side surface and said face are provided structural integrity by said face seam and said base band as well as a spiral nature of said spring band;
   an open end placed over said utility revenue meter and slid until said base band is directly adjacent to a retaining collar of said electric utility revenue meter, electrical continuity of said base band, essential to mainlining EMF shielding, is provided by a pair of upper tabs;

a spring band provided around a perimeter of said side surface in a spiraling position, said spring band is fastened at a first end to the base band and is fastened at a second end to said face seam, said spring band allows said collapsible shield to retain being open and expanded; and a plurality of spring clips mechanically and electrically mated to said base band via use of a fastener, said spring clips are connected to said retaining collar on said electric utility revenue meter.

2. The collapsible shield according to claim 1, wherein said flexible metal screen provides both visual clarity through its surface for purposes of verification of electricity usage for billing purposes and blocks electromagnetic force radiation of certain frequencies.

3. The collapsible shield according to claim 2, wherein said flexible metal screen is made of an anti-corrosion material.

4. The collapsible shield according to claim 3, wherein said anti-corrosion material is made of stainless steel.

5. The collapsible shield according to claim 4, wherein said stainless steel is coated with an anti-corrosion finish selected from the group of a galvanizing finish, a plating finish, or a painting finish.

6. The collapsible shield according to claim 3, wherein said anti-corrosion material is made of conventional steel material.

7. The collapsible shield according to claim 6, wherein said conventional steel material is coated with an anti-corrosion finish selected from the group of a galvanizing finish, a plating finish, or a painting finish.

8. The collapsible shield according to claim 1, wherein at least 3 said flexible metal screens are electrically and physically attached to said base band and extend inward.

9. The collapsible shield according to claim 1, wherein said base band is eight inches in diameter and six inches in height.

10. The collapsible shield according to claim 1, wherein said spring band is fastened continuously to said side surface.

11. The collapsible shield according to claim 1, wherein said spring band is fastened periodically to said side surface.

12. The collapsible shield according to claim 1, wherein said spring band is made of plastic which retains a memory of its expanded position.

13. The collapsible shield according to claim 1, wherein said spring band is made of metal which retains a memory of its expanded position.

14. The collapsible shield according to claim 1, further comprising a collapsed state occurring with application of an external force upon said face and which spans across said perimeter of said face seam.

15. The collapsible shield according to claim 14, wherein said collapsed state is maintained by a temporary retraining device selected from the group consisting of a tape, an elastic band, or a nylon strap.

16. The collapsible shield according to claim 15, wherein said temporary retraining device allows for easy removal of said collapsible shield from a shipping container upon receipt, after purchase, or prior to installation.

17. The collapsible shield according to claim 1, wherein said fastener is a rivet.

18. The collapsible shield according to claim 1, wherein said fastener is a screw.

19. The collapsible shield according to claim 1, further comprising a securing aid to further aid in retenting of said collapsible shield to the retaining collar.

20. The collapsible shield according to claim 1, wherein said collapsible shield having a generally cylindrical shape.

* * * * *